United States Patent
Hahn

(10) Patent No.: US 8,490,210 B2
(45) Date of Patent: Jul. 16, 2013

(54) CONTACT TYPE PLASMONIC NANO OPTICAL PROBE, PARALLEL PROBE CONSTITUTED OF THE SAME, PLASMONIC OPTICAL APPARATUS INCLUDING THE PARALLEL PROBE, AND A METHOD OF FABRICATING THE PARALLEL PROBE

(75) Inventor: Jae Won Hahn, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 284 days.

(21) Appl. No.: 12/960,615

(22) Filed: Dec. 6, 2010

(65) Prior Publication Data

US 2011/0192996 A1 Aug. 11, 2011

(30) Foreign Application Priority Data

Feb. 11, 2010 (KR) ........................ 10-2010-0012629

(51) Int. Cl.
*G01Q 60/19* (2006.01)
(52) U.S. Cl.
USPC ........................... 850/30; 250/505.1; 250/306
(58) Field of Classification Search
USPC .......................................................... 850/30
See application file for complete search history.

(56) References Cited

U.S. PATENT DOCUMENTS

| | | | | |
|---|---|---|---|---|
| 5,066,142 A | * | 11/1991 | DeFrank et al. | 374/208 |
| 7,034,854 B2 | * | 4/2006 | Cruchon-Dupeyrat et al. | 346/140.1 |
| 2007/0194225 A1 | * | 8/2007 | Zorn | 250/306 |

OTHER PUBLICATIONS

Kenya Goto, et al; "Microoptical Two-Dimensional Devices for the Optical Memory Head of an Ultrahigh Data Transfer Rate and Density System Using a Vertical Cavity Surface Emitting Laser (VCSEL) Array", Jpn. J. Appl. Phys., vol. 41, pp. 4835-4840, Part 1, No. 7B, Jul. 2002.

Xiaolei Shi, et al.; A Nano-aperture with 1000X Power Throughput Enhancement for Very Small Aperture Laser System (VSAL), Optical Data Storage 2001, Proceedings of SPIE, vol. 4342 (2002), pp. 320-327.

* cited by examiner

*Primary Examiner* — Phillip A Johnston
(74) *Attorney, Agent, or Firm* — Ladas & Parry LLP

(57) ABSTRACT

A contact type plasmonic nano optical probe, a parallel probe constituted of the same, a plasmonic optical apparatus including the parallel probe, and a method of fabricating the parallel probe are disclosed. A contact type plasmonic nano optical probe includes a probe tip which protrudes in a truncated shape having a narrower plan surface and a wider plan surface relatively wider than the narrower plan surface, of which a metal thin film is coated on a surface, of and which an aperture of nm diameter included in a portion of the metal thin film on a central portion of the narrower plan surface, a spring structure disposed at a perimeter of the probe tip and configured to maintain a distance between the probe tip and a film to be exposed, a dielectric filled within the aperture, and a protection layer disposed on the narrower plan surface of the probe tip. Here, an optical transport path is included within the probe tip to be connected to the aperture. A plasmonic optical apparatus including a parallel plasmonic probe is constituted of a probe array including a plurality of probe modules in which the contact type plasmonic nano optical probes are disposed at a uniform distance on a substrate.

7 Claims, 3 Drawing Sheets

CONTACT TYPE PLASMONIC NANO OPTICAL PROBE, PARALLEL PROBE CONSTITUTED OF THE SAME, PLASMONIC OPTICAL APPARATUS INCLUDING THE PARALLEL PROBE, AND A METHOD OF FABRICATING THE PARALLEL PROBE

CROSS-REFERENCES TO RELATED APPLICATION

The present application claims priority under 35 U.S.C. 119(a) to Korean application number 10-2010-0012629, filed on Feb. 11, 2010, in the Korean Patent Office, which is incorporated by reference in its entirety as if set forth in full.

BACKGROUND OF THE INVENTION

1. Technical Field

The embodiments described herein relate to an optical system and, more particularly, to a contact type plasmonic nanometer grade (hereinafter, nano) optical probe, a parallel probe constituted of the same, a plasmonic optical apparatus including the parallel probe, and a method of fabricating the parallel probe.

2. Related Arts

Resolutions of optical systems used in a process of fabricating circuits must be enhanced to increase an integration density of a semiconductor integrated circuit. That is, circuit patterns with a fine line width are demanded to increase an integration density of a semiconductor integrated circuit and these circuit patterns depend on resolution of an optical system.

Accordingly, light sources and optical systems having the resolution below a wave length of an exposure light which has been using currently are required. However, to develop a new light source or to embody a new high-tech optical system requires high development expense and it is difficult to fulfill it in practice.

Therefore, studies on various methods of improving the resolution by alternating a current light source and a current exposure apparatus have been progressed. As one of the various methods, a method of fabricating fine patterns by a plasmonic effect based on a near-field is disclosed in Korean patent laid open No. 10-2005-0001086 by this applicant.

As disclosed in "A nano aperture with 1000× power throughput enhancement for VSAL system", 2003, SPIE, Vol. 4342, pp 320-327, the plasmonic effect is a phenomenon that transmittance of the light passed through the hole of nm diameter disposed in a metal film is remarkably increased. If the Plasmonic effect is applied to a lithographic principle, transmittance and optical flux of an incident light are largely enhanced by the Plasmonic effect based on the near-field, so that fine patterns can be accurately fabricated.

It is very important to improve exposure uniformity in the lithography method using the near-field. The exposure uniformity depends on maintaining a distance between an optical structure which including a hole of nm diameter and a film to be exposed (this is, a photoresist film). That is, the distance is a basic structure for generating the near-field and the distance between the light source and the film to be exposed must be maintained below several ten nm. In addition, a parallel process technique which disposes probes having nano apertures in an array type is a method obtaining high productivity. However, it is difficult to control a gap between each of probes and a piece below several ten nm so as to near-field pattern several thousand or several hundred thousand parallel probes in practice.

In recent years, a method of maintaining the distance by interposing an immersion material layer or a wall is disclosed in "Micro-optical Two-Dimensional Device for the Optical Memory Head of an Ultrahigh Data Transfer Rate And Density System Using a Vertical Cavity Surface Emitting Laser Array", Jpn. J. Appl. Phys. Vol. 41 (2002) pp. 4835-4840. However, the method can not ensure to uniformly maintain the distance between each of all probes disposed in parallel and a film to be exposed.

SUMMARY

According to one aspect of an example embodiment, a contact type plasmonic optical probe includes a probe tip which protrudes in a truncated shape having a narrower plan surface and a wider plan surface which is relatively wider than the narrower plan surface, of which a thin metal film is coated on a surface, and of which an aperture of nm diameter included in a portion of the thin metal film on a central portion of the narrower plan surface, a spring structure formed on a perimeter of the probe tip and configured to maintain a contact between the probe tip and a film to be exposed, a dielectric filled within the aperture, and a protection layer formed on the narrower plan surface of the probe tip to maintain a gap distance between the probe tip and the film to be exposed. An optical transport path is included within the probe tip to be connected to the aperture.

According to another aspect of another example embodiment, an optical apparatus includes a substrate and a plurality of contact type plasmonic optical probe modules disposed at a uniform distance on the substrate.

According to still another aspect of another example embodiment, a method of fabricating an optical apparatus includes simultaneously fabricating parallel prove modules using a silicon process to uniformly fabricate a plurality of probes. According to still another aspect of another example embodiment in accordance with embodiments, parallel prove modules of an optical apparatus are simultaneously fabricated using a silicon process to uniformly fabricate a plurality of probes.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
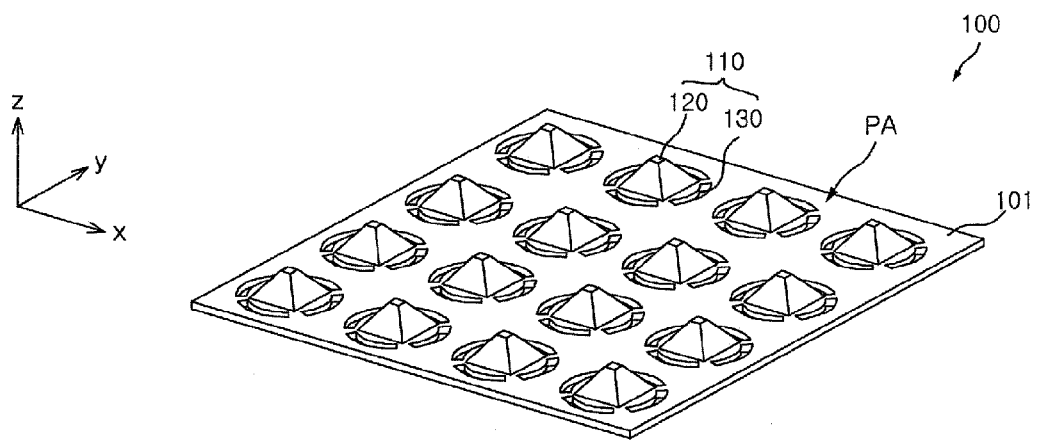
FIG. 1 is a perspective view illustrating a plasmonic optical apparatus in which contact type plasmonic nano optical probes are attached in parallel in accordance with embodiments of the inventive concept.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements.

Figure 2:
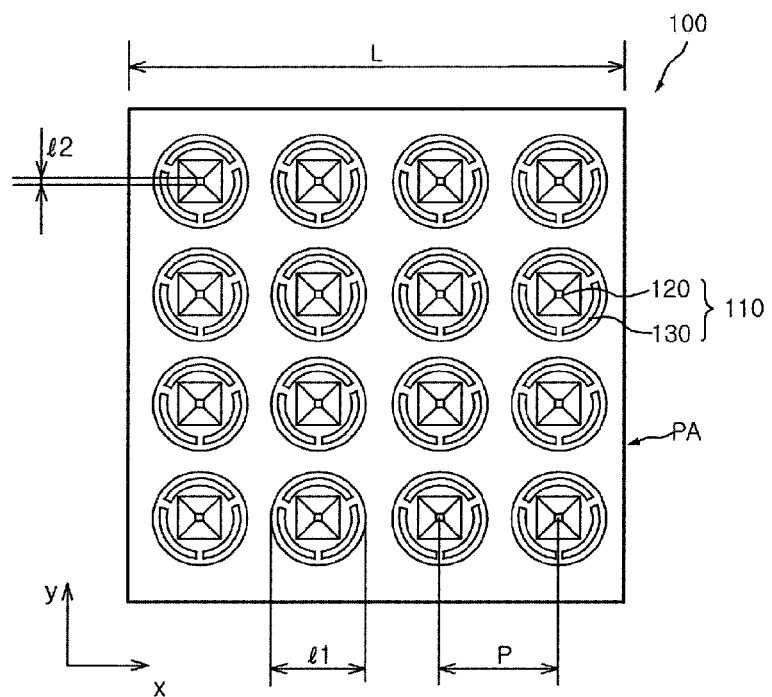
FIG. 2 is a plan view of a plasmonic optical apparatus in which contact type plasmonic nano optical probes are attached in parallel in accordance with embodiments of the inventive concept.

FIG. 1 is a perspective view illustrating a plasmonic optical apparatus in accordance with embodiments of the inventive concept and FIG. 2 is a plan view of a plasmonic optical apparatus in accordance with embodiments of the inventive concept.

Referring to FIGS. 1 and 2, a plasmonic optical apparatus 100 may include a substrate 101 and a plurality of probe modules 110 disposed on the substrate 101. The plurality of probe modules 110 is disposed at a uniform distance in a matrix to constitute a probe module array PA. In the exemplary embodiment, the probe module array PA may be regarded as a parallel probe.

The substrate 101, for example, may be a silicon substrate, that is a semiconductor wafer.

In addition, all the plurality of probe modules 110 may have the same shapes. A pitch P between adjacent probe modules 110 may be about several μm to several ten μm and a bottom diameter I1 of each of the probe modules 110 may be 1 μm to 2 μm smaller than the pitch P and a top diameter I2 may be 0.5 μm to 1.0 μm.

Figure 3:
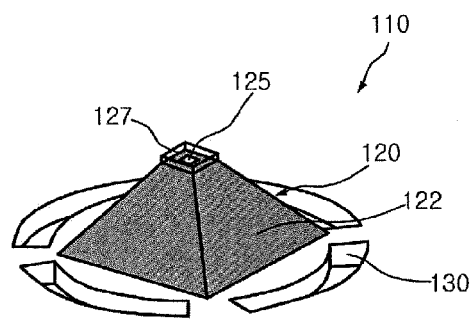
FIG. 3 is an enlarged perspective view of a contact type plasmonic nano optical prove module in accordance with embodiments of the inventive concept.

Each of the probe modules 110 may include a probe tip 120 and a spring structure 130 disposed at a perimeter of the probe tip 120, as illustrated in FIG. 3.

The probe tip 120 may be formed in a truncated shape such as a truncated cone or a truncated pyramid. That is, the probe tip 120 is formed such that a diameter of a top surface is relatively smaller than a diameter of a bottom surface and hereinafter, a narrower plan surface is to be in contact with the film to be exposed (not shown).

A surface of the probe tip 120 is coated with a metal thin film 122 and a nano aperture 125 is included in at a portion of the metal thin film which is corresponding to the narrower plan surface. Not shown in drawings, the nano aperture 125 is connected to an optical transport path within the probe tip 120.

At this time, a transparent solid material such as a dielectric is filled within the nano aperture 125 to prevent damage of the nano aperture 125 which is to be occurred in the following transferring of the probe module array PA. Various materials may be used as the dielectric according to a wavelength of an incident light and for example, a silica glass ($SiO_2$) may be used as the dielectric at a wavelength of 400 nm.

On the other hand, in order to maintain the distance between the probe tip 120 and the film to be exposed at a constant and to prevent friction damage of the nano aperture 125 in contacting the probe tip 120, a protection layer 127 is further formed on a contact surface of the probe tip 120, that is a surface at which the nano aperture is formed. The protection layer 127 plays a role in protecting the contact surface of the probe tip 120 and maintaining the constant distance with the nano aperture 125 and the film to be exposed. A lubricating film which penetrates the incident light and has a low friction coefficient and high strength may be used as the protection layer 127. For example, a diamond like carbon (DLC) or a silica glass ($SiO_2$) may be used as the protection layer 127.

In addition, as the metal thin film 122 coated on the surface of the probe tip 120, a material which has a low absorption at the wavelength area of the incident light and easily generates surface plasmon may be used. In some cases, an opaque material for the incident light may be used. For example, in the case where a light source having a wavelength of 400 nm is used as the incident light source, an Al (Aluminum) thin film may be used as the metal thin film 122 and in the case where a light source having a wavelength of 600 nm is used as the incident light source, an Au (Gold) thin film may be used as the metal thin film 122. In addition, the nano aperture 125 may have a diameter of several to several hundred nm as denoted from the meaning of the word "nano" and be embodied in a various shape such as a bow tie shape, a C-shape, an H-shape, etc.

The spring structure 130 is disposed at the perimeter of each of the probe tips 120. The spring structure 130 may have a substantial ring shape in a plan view. Preferably, the ring type spring structure 130 may have a split ring shape in which a plurality of portions is split to be symmetrical at X-axis and Y-axis directions in a plan view.

The spring structure 130 determines adhesion force between the probe tip 120 and the film to be exposed (200 in FIG. 4) by a displacement of a Z-axis direction. That is, the fine distance between the nano aperture 125 and the film 200 to be exposed can be maintained by an elastic force of the spring structure 130. In addition, the spring structure 130 is disposed to be symmetrical in the X-axis and Y-axis directions such that each of the probe modules 110 has the symmetric dynamic property in the following transferring of the probe module array PA.

That is, the probe tip 120 is in contact with the film to be exposed by forming a thin film having a thickness corresponding to the distance between the film to be exposed and the probe tip 120 on the plan surface of the probe tip 120 and by applying a vertical force to the probe tip 120 using the spring structure 130 such that the distances between all the probe tip 120 and the film to be exposed can be uniformly maintained.

Figure 4:
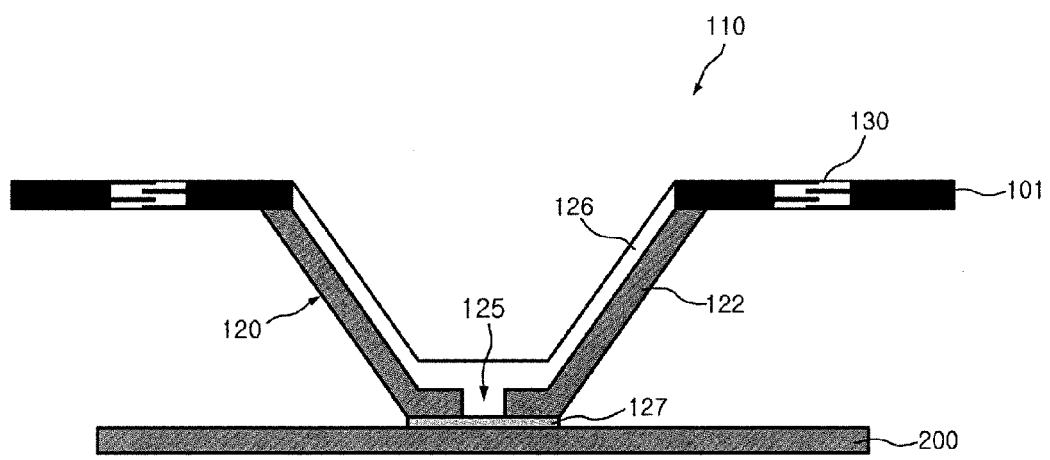
FIG. 4 is a cross-sectional view of a contact type plasmonic nano optical probe module in accordance with embodiments of the inventive concept.

FIG. 4 is a cross-sectional view of a probe module in accordance with embodiments of the inventive concept. FIG. 4 shows a contact structure between a film 200 to be exposed and a probe tip 120 under the state that the probe module of FIG. 3 is rotated by 180 degrees.

Referring to FIG. 4, a probe module 110 includes a substrate 101 which supports the probe tip 120 and includes a spring structure 130. The substrate 101 may be a silicon wafer as described above and supports the probe tip 120 disposed on a center portion thereof.

The probe tip 120 protrudes at a predetermined length to be in contact with the film 200 to be exposed which is to be actually patterned. The surface of the probe tip 120 is coated with a metal thin film 122 and a nano aperture 125 is formed at a portion of the metal thin film 122 corresponding to a contact surface with the film 200 to be exposed as described above.

In addition, a dielectric 126 is formed along an inner surface of the probe tip 120, this is an inner surface of the metal thin film 122. At this time, the dielectric 126 is formed to be filled within the nano aperture 125 to prevent damage of the nano aperture 125.

A protection layer 127 is formed on the contact surface of the probe tip 120 which is to be in contact with the film 200 to be exposed as described above.

The spring structure 130 is disposed the substrate 101 supporting to the probe tip 120 to control the contact between the probe tip 120 and the film 200 to be exposed.

The probe modules 110 of the inventive concept are simultaneously formed by a silicon process with ultra-high fabrication uniformity. Herein, the silicon process is used in a typical micro-electromechanical system (MEMS) and each unit process is obvious to those skilled in the art. According to this, the probe module arrays PA of the inventive concept have all the same shapes and all the same contact force. Accordingly, a mask (not shown) constituted of probe modules 110 has all the same shapes so that mask pattern uniformity can be significantly improved.

In addition, the plurality of probe tips 120 of the exemplary embodiment is simultaneously in contact with the film to be exposed (not shown) such that the probe modules 110 can be constituted in a parallel type. The batch exposure can be performed by the parallel type probe modules 110 and the probe module array PA moves to perform the batch exposure so that high speed lithographic process can be performed.

In addition, the light transmittance of the aperture is significantly improved by combining the plasmonics formed in the metal thin film around the nano aperture 125 of the probe tip 120 at which the light is radiated such that the optical flux focused below several tens nm is provided as an exposure light.

Figure 5:
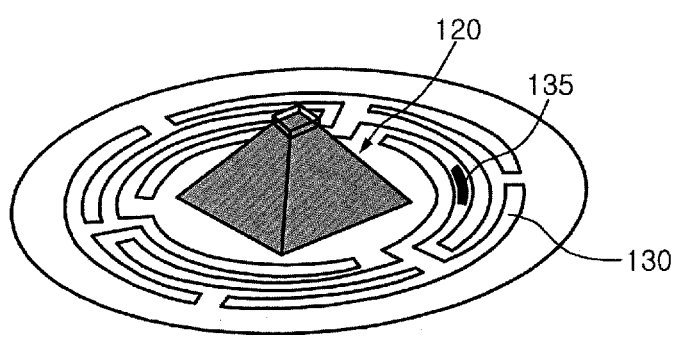
FIG. 5 is a perspective view of a contact type nano optical probe module in which a spiral spring structure for measuring a displacement of a spiral spring in accordance with embodiments of the inventive concept.

Furthermore, as illustrated in FIG. 5, a strain gauge 135 may further be disposed adjacent to a string structure 130. The strain gauge 135 is attached to a proper portion of a center area of the spring structure 130 as illustrated in FIG. 5 to effectively measure a deformation of a spring. When the spring structure 130 is deformed by the contact of the probe tip 120, that is when an elastic force is formed, the strain gauge 135 measures deflection amount (elastic force) such that an adhesion strength between the probe tip 120 and the photoresist film (200 in FIG. 4) can be easily measured. Furthermore, the strain gauge 135 measures the distance between the probe tip 120 and the photoresist film 200 to accurately monitor the exposure process, thus, improving the exposure uniformity.

As described above, the inventive concept forms a plurality of probe tips each of which have a nano aperture and a spring structure surrounding each probe tip on a semiconductor wafer to constitute an optical apparatus.

The plurality of probe tips is in contact with the film to be exposed by each corresponding spring structure to ensure a uniform exposure light.

In addition, the probe module is fabricated by a simple silicon process with ultra-high uniformity to fabricate a parallel probe module array with high uniformity such that the uniformity of the exposure light can be improved, the fabrication cost can be reduced, and high speed lithography can be obtained.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An optical apparatus, comprising:
a substrate; and
a probe module array constituted of a plurality of probe modules disposed at a uniform distance on the substrate, wherein each of the plurality of probe modules includes:
a probe tip which protrudes in a truncated shape having a narrower plan surface and a wider plan surface relatively wider than the narrower plan surface, of which a metal thin film is coated on a surface, and of which an aperture of nm diameter is included in a portion of the metal thin film on a central portion of the narrower plan surface;
a spring structure disposed at a perimeter of the probe tip and configured to maintain a gap distance with the probe tip and a film to be exposed;
a dielectric filled within the aperture; and
a protection layer disposed on the narrower plan surface of the probe tip, wherein an optical transport path is included within the probe tip to be connected to the aperture.

2. The optical apparatus of claim 1, wherein the substrate is a silicon wafer.

3. The optical apparatus of claim 1, wherein the spring structure is disposed at a perimeter of both sides of the probe tip, and has a split ring shape to be symmetrical in X-axis and Y-axis directions in a plan view.

4. The optical apparatus of claim 1, further comprising a strain gauge disposed adjacent to the spring structure to measure an elastic force of the spring structure.

5. The optical apparatus of claim 1, wherein the dielectric is a transparent material for an incident light.

6. The optical apparatus of claim 5, wherein the dielectric is coated on an inner side of the metal thin film of the probe tip.

7. The optical apparatus of claim 1, wherein the protection layer is a diamond like carbon (DLC).

* * * * *